(12) United States Patent
Khang et al.

(10) Patent No.: US 7,763,886 B2
(45) Date of Patent: Jul. 27, 2010

(54) DOPED PHASE CHANGE MATERIAL AND PRAM INCLUDING THE SAME

(75) Inventors: Yoon-ho Khang, Yongin-si (KR); Daniel Wamwangi, Aachen (DE); Matthias Wuttig, Aachen (DE); Ki-joon Kim, Yongin-si (KR); Dong-seok Suh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 439 days.

(21) Appl. No.: 11/980,431

(22) Filed: Oct. 31, 2007

(65) Prior Publication Data

US 2008/0149908 A1    Jun. 26, 2008

(30) Foreign Application Priority Data

Nov. 2, 2006    (KR) .................. 10-2006-0107929

(51) Int. Cl.
*H01L 45/00* (2006.01)
*C01B 19/00* (2006.01)

(52) U.S. Cl. .......... 257/42; 257/E27.004; 257/E45.002; 257/E47.001; 257/E45.003; 257/3; 257/4

(58) Field of Classification Search .......... 257/E27.004, 257/E45.002, 2, E47.001, E45.003, 3, 4, 257/42
See application file for complete search history.

(56) References Cited

U.S. PATENT DOCUMENTS 6,896,946 B2 * 5/2005 Chen ..................... 428/64.1
2007/0131161 A1 * 6/2007 Sherohman et al. ......... 117/108

FOREIGN PATENT DOCUMENTS

JP          02064931 A  *  3/1990

\* cited by examiner

*Primary Examiner*—Matthew E Warren
*Assistant Examiner*—David Spalla
(74) *Attorney, Agent, or Firm*—Harness, Dickey & Pierce, P.L.C.

(57) ABSTRACT

Provided are a doped phase change material and a phase change memory device including the phase change material. The phase change material, which may be doped with Se, has a higher crystallization temperature than a $Ge_2Sb_2Te_5$ (GST) material. The phase change material may be $In_XSb_YTe_ZSe_{100-(X+Y+Z)}$. The index X of indium (In) is in the range of 25 wt % $\leq X \leq$ 60 wt %. The index Y of antimony (Sb) is in the range of 1 wt % $\leq Y \leq$ 17 wt %. The index Z of tellurium (Te) is in the range of 0 wt % $< Z \leq$ 75 wt %.

10 Claims, 1 Drawing Sheet

DOPED PHASE CHANGE MATERIAL AND PRAM INCLUDING THE SAME

PRIORITY STATEMENT

This application claims the benefit of Korean Patent Application No. 10-2006-0107929, filed on Nov. 2, 2006 in the Korean Intellectual Property Office, the entire disclosure of which is incorporated herein by reference.

BACKGROUND

1. Field

Example embodiments relate to a memory device, and more particularly, to a doped phase change material doped and a phase change memory device including the phase change material.

2. Description of the Related Art

A phase change memory device (PRAM) is a type of non-volatile memory device such as a ferrodielectric RAM (Fe-RAM) and a magnetic RAM (MRAM), for example. The difference of the PRAM from other non-volatile memory devices lies in a storage node of the PRAM.

Generally, the storage node of the PRAM includes a phase change layer that changes from a crystalline state to an amorphous state at a first temperature, and changes from an amorphous state to a crystalline state at a second temperature that is lower than the first temperature.

The resistance of the phase change layer when the phase change layer is in an amorphous state is referred to herein as a first resistance, and the resistance of the phase change layer when the phase change layer is in a crystalline state is referred to herein as a second resistance. Generally, the first resistance is larger than the second resistance.

A conventional PRAM writes and reads data by using the characteristics of the resistance of the phase change layer. The resistance of the phase change layer may change based on the state of the phase change layer. Presently, a $Ge_2Sb_2Te_5$ (GST) layer is widely used as the phase change layer of a conventional PRAM.

Generally, an ideal phase change material is considered to be a material that has low thermal conductivity and a low melting point at which the phase changes from the crystalline state to the amorphous state. Further, the ideal phase change material has a high resistance when the phase is amorphous and a high crystallization temperature at which the phase changes from the amorphous state to the crystalline state in order to obtain thermal stability.

However, the GST layer has a melting point that is greater than 600° C. and a relatively low resistance. Accordingly, in the case of the conventional PRAM in which the GST layer is used as the phase change layer, a high reset current to change a portion of the phase change layer into an amorphous state must be applied. In the conventional PRAM, the GST layer changes from the amorphous state to the crystalline state at about 160° C. Thus, the GST layer of the conventional PRAM cannot be used in the case where a high thermal stability is required.

SUMMARY

An example embodiment provides a phase change material, which can increase a thermal stability of the phase change material by increasing a crystallization temperature of the phase change material.

An example embodiment provides a phase change memory device including the phase change material.

An example embodiment provides a phase change material. The phase change material may have a higher crystallization temperature than a $Ge_2Sb_2Te_5$ (GST) material and is doped with selenium (Se).

According to an example embodiment, the SE is in a range of 0 wt % to 74 wt %.

According to an example embodiment, the phase change material may be $In_XSb_YTe_ZSe_{100-(X+Y+Z)}$ mainly including indium (In), antimony (Sb), and tellurium (Te).

The index X of indium (In) may be in the range of 25 wt % $\leq$ X $\leq$ 60 wt %.

The index Y of Sb may be in the range of 1 wt % $\leq$ Y $\leq$ 20 wt %. The index Z of Te may be in the range of 0 wt % < Z $\leq$ 75 wt %. More specifically, the indices X, Y, and Z may be in the ranges of 40 wt % $\leq$ X < 60 wt %, 5 wt % $\leq$ Y < 17 wt %, and 0 wt % < Z < 20 wt %, respectively.

Another example embodiment provides a phase change memory device. The phase change memory device may include a storage node in which data is stored and a switching device connected to the storage node. The phase change layer has a higher crystallization temperature than a GST material and is doped with Se.

According to an example embodiment, thermal stability can be secured at a temperature of 160° C. or higher for the phase change memory device and/or phase change material.

BRIEF DESCRIPTION OF THE DRAWING

The above and other features, aspects and advantages of example embodiments will become more apparent by considering the following detailed description of example embodiments, which refers to attached FIG. 1 illustrating a cross-section of an example embodiment of a phase change memory device including a phase change material doped with selenium (Se).

DETAILED DESCRIPTION OF EXAMPLE EMBODIMENTS

Figure 1:
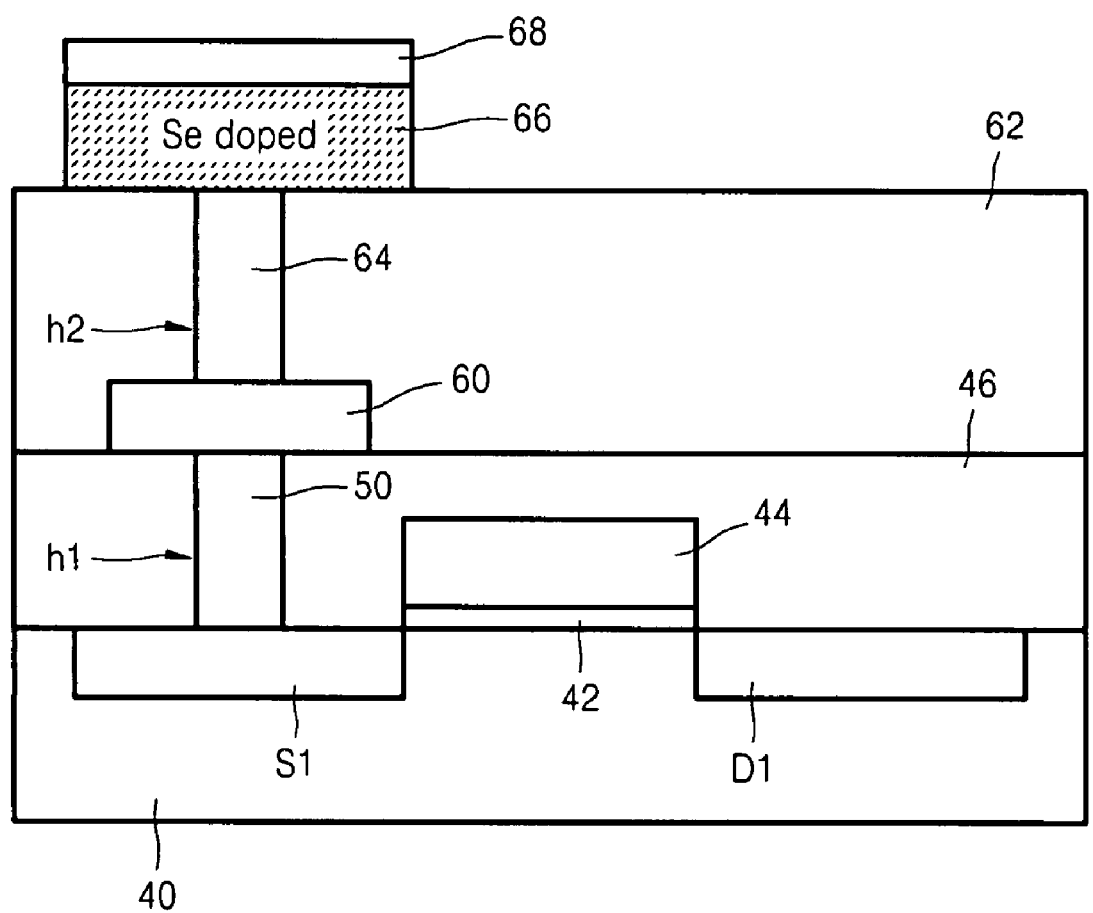

Various example embodiments will now be described more fully with reference to the accompanying drawing. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein, to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawing are provided so that this disclosure will be thorough, complete and fully convey the concept of example embodiments to those skilled in the art. Further, the thicknesses of layers and regions are exaggerated for clarity in the drawing.

Hereinafter, a phase change material doped with selenium (Se) and a phase change memory device including the phase change material will be described more fully with reference to the accompanying drawing. An example embodiment of a memory device and the phase change material will be described together.

FIG. 1 illustrates a cross-section of an example embodiment of a phase change memory device.

Referring to FIG. 1, first and second impurity regions S1 and D1 are formed in a substrate 40 with an interval therebetween. The first and second impurity regions S1 and D1 are doped with an impurity. For example, the first and second impurity regions S1 and D1 may be doped with an n-type impurity. According to an example embodiment, the substrate 40 is doped with an opposite type of impurity as that of the first and second impurity regions S1 and D1. For example, if the first and second impurity regions S1 and D1 are doped with an n-type impurity, the substrate 40 is a p-type silicon substrate. The first and second impurity regions S1 and D1 may have various shapes and are not limited to the shapes illustrated in FIG. 1. One of the first and second impurity regions S1 and D1 may be a source region, and the other may be a drain region. A gate insulating layer 42 and a gate electrode 44 may be sequentially stacked on the substrate 40 between the first and second impurity regions S1 and D1. The substrate 40, the first and second impurity regions S1 and D1, and the gate electrode 44 illustrated in FIG. 1 constitute a field effect transistor (hereinafter referred to as a 'transistor'). The transistor may be used as a switching device, for example.

A first insulating interlayer 46 may be formed on the substrate 40. As shown in FIG. 1, the first insulating interlayer 46 is formed on the substrate 40 and covers the transistor. According to an example embodiment, a contact hole h1 is formed to expose at least one of the first and second impurity regions S1 and D1. In FIG. 1, a contact hole h1 through which the first impurity region S1 is exposed is formed in the first insulating interlayer 46. The contact hole h1 may be formed in a position where the second impurity region D1 is exposed instead of the position where the first impurity region S1 is exposed according to an alternative embodiment. The contact hole h1 shown in FIG. 1 is filled with a conductive plug 50.

Still referring to FIG. 1, a bottom electrode 60 is formed on the first insulating interlayer 46. The bottom electrode 60 may be formed to cover an exposed top surface of the conductive plug 50. The bottom electrode 60 may also function as a pad. The bottom electrode 60 may be a TiN electrode or a TiAlN electrode, or may be formed of other materials, for example. In FIG. 1, a second insulating interlayer 62 that covers the bottom electrode 60 is formed on the first insulating interlayer 46. The second insulating interlayer 62 may be the same as the first insulating interlayer 46. A via hole h2 may be formed in the second insulating interlayer 62 to expose a top surface of the bottom electrode. In FIG. 1, the via hole h2 is filled with a bottom electrode contact layer 64. The bottom electrode contact layer 64 may be formed of the same material as the bottom electrode 60. According to an example embodiment, a phase change layer 66 is formed on the second insulating interlayer 62 to cover an exposed top surface of the bottom electrode contact layer 64. A top electrode 68 may be formed on the phase change layer 66. The phase change layer 66 is a storage node where information is recorded according to an example embodiment. The phase change layer 66 is electrically connected to the transistor in FIG. 1.

According to an example embodiment, the phase change layer 66 may be a layer formed of a material doped with selenium (Se) or a material to which Se is added. The phase change layer 66 has a higher crystallization temperature than a conventional Ge2Sb2Te5 (GST) layer according to an example embodiment. For example, the phase change layer 66 may be composed of $In_XSb_YTe_ZSe_{100-(X+Y+Z)}$. In the phase change layer 66, the value of the index X of indium (In) may be in the range of 25 wt %$\leq$X$\leq$60 wt %. The index Y of antimony (Sb) may be in the range of 1 wt %$\leq$Y$\leq$20 wt %. The index Z of tellurium (Te) may be in the range of 0 wt %<Z$\leq$75 wt %. Considering the ranges of X, Y and Z for In, Sb and Te, respectively, the index a1 of Se may be in the range of 0 wt %<a1<74 wt % in the phase change layer $In_XSb_YTe_ZSe_{a1=100-(X+Y+Z)}$.

According to a more specific embodiment, the value of the index X of In may be in the range of 40 wt %$\leq$X<60 wt %, the value of the index Y of Sb may be in range of 5 wt %$\leq$Y<17 wt %, and the value of the index Z of Te may be in the range of 0 wt %<Z<20 wt %. According to this embodiment, the index a1 (a1=100−(X+Y+Z)) of the doped Se may be in the range of 0 wt %<a1<55 wt %.

While example embodiments have been described above, example embodiments should be considered in a descriptive sense only and not for purposes of limitation. For example, it will be understood by one skilled in the art that Se can be doped or added to other phase change materials besides the InSbTe (IST) material or other elements besides Se can be doped or added to the IST material. Also, a case where two or more elements are doped or added to the IST material should also be considered within the scope of example embodiments. Also, the phase change layer doped with Se may be formed of different constituents other than IST material.

As described above, a memory device according to an example embodiment includes an IST layer, which is doped with Se or to which Se is added, as a phase change layer. Example embodiments of the memory device may provide thermal stability at a temperature higher than about 160° C.

What is claimed is:

1. A phase change memory device, comprising:
   a storage node in which data is stored, wherein the storage node includes a phase change layer formed of a phase change material, a switching device connected to the storage node, wherein the phase change layer is formed of $In_xSb_yTe_zSe_{(100-(x+y+z))}$.

2. The phase change memory device of claim 1, wherein the selenium (Se) is in a range of >0 wt %-74 wt %, inclusive.

3. The phase change memory device of claim 1, wherein the following expression, 25 wt % $\leq$ X<60 wt %, is satisfied.

4. The phase change memory device of claim 3, wherein the following expression, 40 wt % $\leq$ X<60 wt %, is satisfied.

5. The phase change memory device of claim 1, wherein the following expression, 1 wt % $\leq$ Y $\leq$ 20 wt %, is satisfied.

6. The phase change memory device of claim 5, wherein the following expression, 5 wt % $\leq$ Y $\leq$ 17 wt %, is satisfied.

7. The phase change memory device of claim 1, wherein the following expression, 0 wt %<Z $\leq$ 75 wt %, is satisfied.

8. The phase change memory device of claim 7, wherein the following expression, 0 wt % $\leq$ Z $\leq$ 20 wt %, is satisfied.

9. The phase change memory device of claim 1, wherein the following expressions, $a_1=100-(X+Y+Z)$ and 0 wt %<$a_1$ $\leq$ 74 wt %, are satisfied.

10. The phase change memory device of claim 9, wherein X, Y, and Z are respectively in the ranges of 40 wt % $\leq$ X<60 wt %, 5 wt % $\leq$ Y<20 wt %, and 0 wt %<Z<20 wt %.

* * * * *